(12) United States Patent
Yun et al.

(10) Patent No.: US 9,761,818 B2
(45) Date of Patent: Sep. 12, 2017

(54) METHOD OF MANUFACTURING THIN FILM TRANSISTOR, THIN FILM TRANSISTOR MANUFACTURED BY THE METHOD, AND ELECTRONIC DEVICE COMPRISING THE THIN FILM TRANSISTOR

(71) Applicant: Samsung Electronics Co., Ltd., Suwon-si, Gyeonggi-do (KR)

(72) Inventors: Youngjun Yun, Yongin-si (KR); Joo Young Kim, Hwaseong-si (KR); Byong Gwon Song, Seoul (KR); Jaewon Jang, Daegu (KR); Jiyoung Jung, Seoul (KR); Ajeong Choi, Suwon-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 15/168,342

(22) Filed: May 31, 2016

(65) Prior Publication Data

US 2017/0194583 A1 Jul. 6, 2017

(30) Foreign Application Priority Data

Dec. 31, 2015 (KR) ........................ 10-2015-0191451

(51) Int. Cl.
*H01L 51/05* (2006.01)
*H01L 51/00* (2006.01)
*H01L 27/28* (2006.01)

(52) U.S. Cl.
CPC ........ *H01L 51/0545* (2013.01); *H01L 27/283* (2013.01); *H01L 51/0017* (2013.01); *H01L 51/0018* (2013.01); *H01L 51/0074* (2013.01); *H01L 51/0558* (2013.01)

(58) Field of Classification Search
CPC combination set(s) only.
See application file for complete search history.

(56) References Cited

U.S. PATENT DOCUMENTS

| 8,269,414 | B2 | 9/2012 | Jeon et al. | |
| 2015/0123100 | A1* | 5/2015 | Lee | H01L 51/0018 257/40 |
| 2016/0254467 | A1* | 9/2016 | Fong | H01L 27/283 257/40 |

FOREIGN PATENT DOCUMENTS

| JP | 2004020760 A | 1/2004 |
| KR | 20070069609 A | 7/2007 |
| KR | 10-0833772 B1 | 5/2008 |

(Continued)

*Primary Examiner* — Mamadou Diallo
(74) *Attorney, Agent, or Firm* — Harness, Dickey & Pierce, P.L.C.

(57) ABSTRACT

A method of manufacturing a thin film transistor includes forming a gate electrode, forming a gate insulating layer on the gate electrode, forming an organic semiconductor layer on the gate insulating layer, forming a solvent selective photosensitive layer on the organic semiconductor layer, forming an organic semiconductor pattern and a solvent selective photosensitive pattern by simultaneously patterning the organic semiconductor layer and the solvent selective photosensitive layer, respectively, and forming a source electrode and a drain electrode on the organic semiconductor pattern and the solvent selective photosensitive pattern, the source electrode and the drain electrode being electrically connected to the organic semiconductor pattern.

20 Claims, 11 Drawing Sheets

(56) References Cited

FOREIGN PATENT DOCUMENTS

KR 20130134389 A 12/2013
KR 20150052763 A 5/2015

\* cited by examiner

METHOD OF MANUFACTURING THIN FILM TRANSISTOR, THIN FILM TRANSISTOR MANUFACTURED BY THE METHOD, AND ELECTRONIC DEVICE COMPRISING THE THIN FILM TRANSISTOR

CROSS REFERENCE TO RELATED APPLICATION

This application claims priority to and the benefit of Korean Patent Application No. 10-2015-0191451 filed in the Korean Intellectual Property Office on Dec. 31, 2015, the entire contents of which are incorporated herein by reference.

BACKGROUND

1. Field

Example embodiments relate to a method of manufacturing a thin film transistor, a thin film transistor manufactured according to the method, and an electronic device including the same.

2. Description of the Related Art

A flat panel display, e.g., a liquid crystal display (LCD), an organic light emitting diode (OLED) display, an electrophoretic display, etc., includes a pair of electric field-generating electrodes and an electrical optical active layer interposed therebetween. The liquid crystal display (LCD) includes a liquid crystal layer as an electric optical active layer, and the organic light emitting diode (OLED) display includes an organic emission layer as an electrical optical active layer.

One of the pairs of the electric field-generating electrodes is commonly connected to a switching device and receives an electrical signal, and the electrical optical active layer transforms the electrical signal into an optical signal and thus displays an image.

The flat panel display includes a thin film transistor (TFT) that is a three-terminal element as a switch.

Research on an organic thin film transistor (OTFT) including an organic semiconductor, e.g., a relatively low molecular weight semiconductor or polymer semiconductor instead of an inorganic semiconductor, e.g., a silicon (Si) semiconductor, as one type of the thin film transistor is being actively conducted.

The organic thin film transistor may be made into a fiber or a film due to characteristics of an organic material and thus draws attention as an essential device based on flexibility, e.g., a flexible display device, a wearable display device, etc., other than a flat panel display and may also be applied to various electronic devices based on a thin film transistor, e.g., RFID (radio frequency identification) tags, various sensors, etc., other than the display devices.

However, because the organic semiconductor may be more easily damaged due to the characteristics of the organic material during subsequent processes, the organic material is required to be protected from the subsequent processes by forming a protective layer thereon the organic semiconductor. Accordingly, because the organic semiconductor and the protective layer are formed through each separate process, time spent during an entire process of manufacturing the thin film transistor (hereinafter, tact time) is increased.

SUMMARY

Example embodiments provide a method of manufacturing a thin film transistor capable of improving a tact time and reducing or minimizing damage to an organic semiconductor during processes.

Example embodiments provide a thin film transistor manufactured using the method.

Example embodiments provide an electronic device including the thin film transistor.

According to example embodiments, a method of manufacturing a thin film transistor includes forming a gate electrode, forming a gate insulating layer on the gate electrode, forming an organic semiconductor layer on the gate insulating layer, forming a solvent selective photosensitive layer on the organic semiconductor layer, forming an organic semiconductor pattern and a solvent selective photosensitive pattern by simultaneously patterning the organic semiconductor layer and the solvent selective photosensitive layer, respectively, and forming a source electrode and a drain electrode on the organic semiconductor pattern and the solvent selective photosensitive pattern, the source electrode and the drain electrode being electrically connected to the organic semiconductor pattern.

Forming the organic semiconductor pattern and the solvent selective photosensitive pattern may include exposing the solvent selective photosensitive layer using a halftone mask, and developing the exposed solvent selective photosensitive layer.

The developed solvent selective photosensitive layer may include a first groove having a first depth and a second groove having a second depth different from the first depth.

The first depth may have a smaller thickness than the exposed solvent selective photosensitive layer.

The second depth may have the same thickness as the exposed solvent selective photosensitive layer.

The developed solvent selective photosensitive layer may expose at least one portion of the organic semiconductor layer to an external environment.

Forming the organic semiconductor pattern and the solvent selective photosensitive pattern may include etching the exposed portions of the developed solvent selective photosensitive layer and the organic semiconductor layer.

The etching may be performed by dry etching.

Forming the organic semiconductor layer may include one of a solution coating process and a deposition process.

Forming the solvent selective photosensitive layer may coat the solvent selective photosensitive layer with a composition that is non-reactive with the organic semiconductor.

The composition may include a fluorine compound including one of a fluorine-containing low molecular weight compound, a fluorine-containing oligomer, a fluorine-containing polymer, and a combination thereof, a photosensitive material, and a fluorine-containing solvent.

According to example embodiments, a thin film transistor is manufactured by the method of example embodiments.

According to example embodiments, an electronic device includes the thin film transistor.

The electronic device may include one of a liquid crystal display (LCD), an organic light emitting diode (OLED) display, an electrophoretic display device, and an organic sensor.

According to example embodiments, a method of manufacturing an electronic device including the method of manufacturing the thin film transistor of example embodiments.

According to example embodiments, a method includes forming a solvent selective photosensitive layer on an organic semiconductor layer, and forming an organic semiconductor pattern and a solvent selective photosensitive pattern including a first patterning process including patterning the solvent selective photosensitive layer, and a second patterning process including simultaneously dry-etching the organic semiconductor layer and the patterned solvent selective photosensitive layer, respectively.

The second patterning process may include a reactive ion etching process (RIE) using oxygen plasma.

The first patterning process may include exposing the solvent selective photosensitive layer using a halftone mask, and developing the exposed solvent selective photosensitive layer.

Forming the solvent selective photosensitive layer may coat the solvent selective photosensitive layer with a composition that is non-reactive with the organic semiconductor.

The composition may include a fluorine compound including one of a fluorine-containing low molecular weight compound, a fluorine-containing oligomer, a fluorine-containing polymer, and a combination thereof, a photosensitive material, and a fluorine-containing solvent.

DETAILED DESCRIPTION

Figure 1:
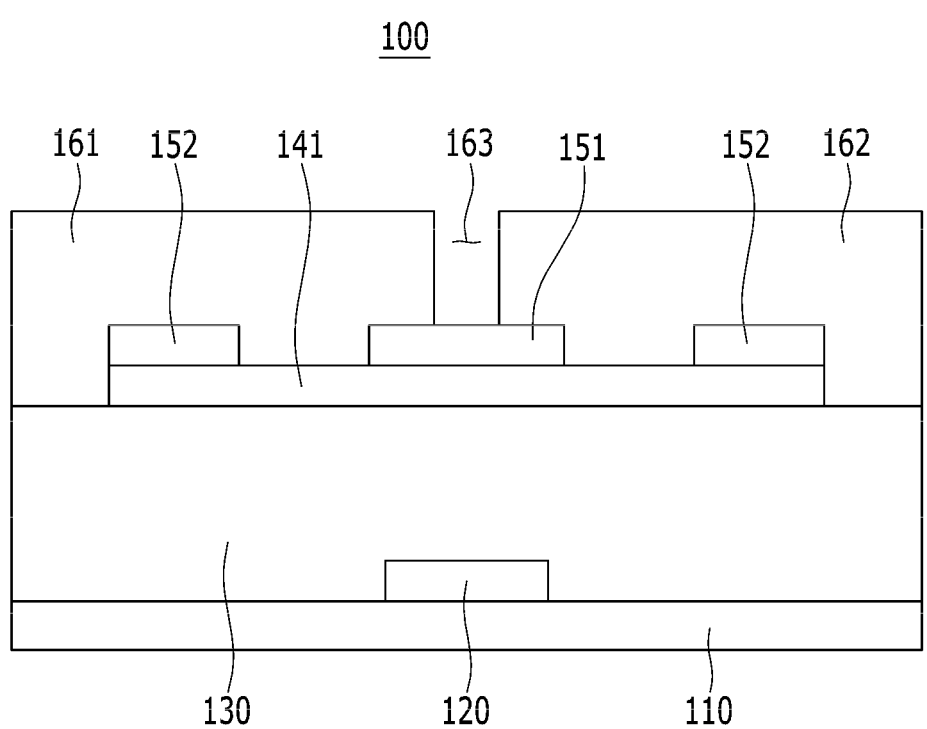
FIG. 1 is a cross-sectional view showing a thin film transistor manufactured by a method of manufacturing a thin film transistor according to example embodiments.

The present disclosure will be described more fully hereinafter with reference to the accompanying drawings, in which example embodiments of this disclosure are shown.

In the drawings, the thickness of layers, films, panels, regions, etc., are exaggerated for clarity. Like reference numerals designate like elements throughout the specification. It will be understood that when an element such as a layer, film, region, or substrate is referred to as being "on" another element, it can be directly on the other element or intervening elements may also be present. In contrast, when an element is referred to as being "directly on" another element, there are no intervening elements present.

It should be understood that, although the terms first, second, third, etc. may be used herein to describe various elements, components, regions, layers and/or sections, these elements, components, regions, layers, and/or sections should not be limited by these terms. These terms are only used to distinguish one element, component, region, layer, or section from another region, layer, or section. Thus, a first element, component, region, layer, or section discussed below could be termed a second element, component, region, layer, or section without departing from the teachings of example embodiments.

Spatially relative terms (e.g., "beneath," "below," "lower," "above," "upper," and the like) may be used herein for ease of description to describe one element or feature's relationship to another element(s) or feature(s) as illustrated in the figures. It should be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" may encompass both an orientation of above and below. The device may be otherwise oriented (rotated 90 degrees or at other orientations) and the spatially relative descriptors used herein interpreted accordingly.

The terminology used herein is for the purpose of describing various embodiments only and is not intended to be limiting of example embodiments. As used herein, the singular forms "a," "an," and "the" are intended to include the plural forms as well, unless the context clearly indicates otherwise. It will be further understood that the terms "includes," "including," "comprises," and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments should not be construed as limited to the shapes of regions illustrated herein but are to include deviations in shapes that result, for example, from manufacturing.

Unless otherwise defined, all terms (including technical and scientific terms) used herein have the same meaning as commonly understood by one of ordinary skill in the art to which example embodiments belong. It will be further understood that terms, including those defined in commonly used dictionaries, should be interpreted as having a meaning that is consistent with their meaning in the context of the relevant art and will not be interpreted in an idealized or overly formal sense unless expressly so defined herein.

In example embodiments, "photosensitive material" refers to a polymer having a photosensitive functional group that is decomposable by light or performs a cross-linking reaction or a polymer that becomes a photosensitive material with a photo-crosslinking agent.

First, the schematic structure of a thin film transistor according to example embodiments is illustrated referring to FIG. 1.

FIG. 1 is a cross-sectional view showing a thin film transistor manufactured by a method of manufacturing a thin film transistor according to example embodiments.

Referring to FIG. 1, a gate electrode 120 is formed on a substrate 110.

The substrate 110 may be made of, for example, transparent glass, silicon, or a polymer. The gate electrode 124 is connected to a gate line (not shown) transmitting a data signal, and may be made of, for example, gold (Au), copper (Cu), nickel (Ni), aluminum (Al), molybdenum (Mo), chromium (Cr), tantalum (Ta), titanium (Ti), tungsten (W), indium tin oxide (ITO), indium zinc oxide (IZO), or an alloy thereof, or polythiophene, polyaniline, polyacetylene, polypyrrole, polyphenylenevinylene, PEDOT (polyethylene dioxythiophene), PSS (polystyrenesulfonate), and a combination thereof, but is not limited thereto.

A gate insulating layer 130 is formed on the gate electrode 120. The gate insulating layer 130 may be made of an organic material or an inorganic material, examples of the organic material may include a soluble polymer compound, e.g., a polyvinyl alcohol-based compound, a polyimide-based compound, a polyacryl-based compound, a polystyrene-based compound, and benzocyclobutane (BCB), and examples of the inorganic material may include a silicon nitride ($SiN_x$) and a silicon oxide ($SiO_2$).

Via holes are formed in the gate insulating layer 130 so that the gate insulating layer 130 and the gate electrode 120 formed in subsequent processes are electrically connected to each other.

An organic semiconductor pattern 141 is formed on the gate insulating layer 130. The organic semiconductor pattern 141 may be disposed at a position overlapping the gate electrode 120 in the center of the gate insulating layer 130, and may have a shape of, for example, an island. The organic semiconductor pattern 141 contacts and is electrically connected to the gate electrode 120 through via holes.

The organic semiconductor pattern 141 may be made of a relatively low molecular weight compound or a polymer compound, and for example, includes at least one selected from pentacene and a derivative thereof, tetrabenzoporphyrin and a derivative thereof, polyphenylenevinylene and a derivative thereof, polyfluorene and a derivative thereof, polythienylenevinylene and a derivative thereof, polythiophene and a derivative thereof, polythienothiophene and a derivative thereof, polyarylamine and a derivative thereof, phthalocyanine and a precursor thereof, metallized phthalocyanine or a halogenated derivative thereof, perylenetetracarboxylic dianhydride (PTCDA), naphthalenetetracarboxylic dianhydride (NTCDA) or an imide derivative thereof, perylene or coronene, and a substituent-containing derivatives thereof.

Among them, the organic semiconductor pattern 141 may be, for example formed by a deposition method, and the deposition-type organic semiconductor material may be, for example, a relatively low molecular weight organic semiconductor material, e.g., pentacene or a pentacene derivative, tetrabenzoporphyrin or a tetrabenzoporphyrin derivative, phthalocyanine or a phthalocyanine derivative, perylene or a perylene derivative, coronene or a coronene derivative, heteroacene, or a heteroacene derivative.

On the other hand, the heteroacene, or the heteroacene derivative of the organic semiconductor materials may be benzodithiophene or a benzodithiophene derivative, and the benzodithiophene derivative may include a fused ring that is provided by fusing one or more benzodithiophene compounds with other cyclic compounds. The cyclic compound may include a fused ring. For example, the other cyclic compounds may include benzene, naphthalene, phenanthrene, or derivatives thereof, but is not limited thereto.

For example, the benzodithiophene derivative may include a fused ring of structures represented by Chemical Formulae 1 to 3.

[Chemical Formula 1]

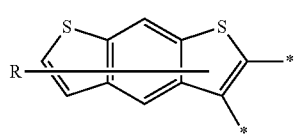

[Chemical Formula 2]

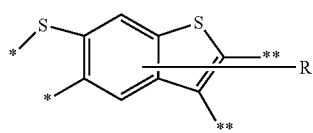

[Chemical Formula 3]

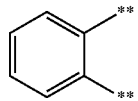

In Chemical Formulae 1 to 3, R is a substituted or unsubstituted $C_1$ to $C_{20}$ alkyl group, * is one of a linking point with the same or different atom and another chemical formula, and ** is one of a hydrogen atom, a linking point with the same or different atom, and another chemical formula.

The benzodithiophene derivative may be, for example, a material represented by Chemical Formula 4 but is not limited thereto.

[Chemical Formula 4]

A first solvent selective photosensitive pattern 151 and a second solvent selective photosensitive pattern 152 are formed on the organic semiconductor pattern 141. The term "solvent selective" refers to causing a chemical interaction with a given or predetermined solvent, for example, dissolving, while substantially not causing the chemical interaction with the material for the organic semiconductor pattern 141, that is being non-reactive with the material for the organic semiconductor pattern 141. The phrase "substantially not causing a chemical interaction" and/or "being non-reactive" refer to not affecting the arrangement, chemical characteristics, and electrical characteristics of an organic semiconductor material used for the organic semiconductor pattern 141.

The first and second solvent selective photosensitive patterns 151 and 152 may be formed from the composition substantially not causing the chemical interaction with the organic semiconductor material used for the organic semiconductor pattern 141, that is, a composition being non-reactive with the material used for the organic semiconductor pattern 141. The composition may include a fluorine compound, a photosensitive material, and a fluorine-containing solvent.

The fluorine compound may include a fluorine-containing relatively low molecular weight compound, a fluorine-containing oligomer, a fluorine-containing polymer, or a combination thereof, and the photosensitive material may be, for example, a photoacid generator that is a material having reactivity with light.

The fluorine compound may include, for example, perfluorinated polymer, polytetrafluoroethylene (PTFE), fluorinated ethylenepropylene (FE P), polyfluoroalkoxy, ethylenetetrafluoroethylene (ETFE), polyvinylidene fluoride (PVDF), perfluoro(alkenylvinyl ether), ethoxynonafluorobutane, or a combination thereof.

For example, a polymer having compatibility or various additives having hydrophobicity, for example, a colorant, a plasticizer, a surfactant, a coupling agent, etc., may optionally be added to the composition and mixed therewith. The various additives having hydrophobicity may be a Teflon (R)-based solution, a Nafion (R)-based solution, etc. These additives may be used alone or as a mixture of two or more. These additives may be used in an amount determined by a person of an ordinary skill in the art related to the described technology.

On the other hand, the first solvent selective photosensitive pattern 151 may be formed to have a smaller width than that of the organic semiconductor pattern 141, and the width of the first solvent selective photosensitive pattern 151 may be substantially equal to the channel length of the thin film transistor. Accordingly, the width of the first solvent selective photosensitive pattern 151 may be adjusted depending on a desired channel length, and thus a short channel length of less than or equal to about 10 µm may be realized by adjusting the width of the solvent selective photosensitive pattern 151.

The first solvent selective photosensitive pattern 151 may not affect the chemical characteristics and the electric characteristics of the organic semiconductor pattern 141 and may reduce or prevent damage to the channel region of the organic semiconductor pattern 141 from plasma and/or a chemical solution, e.g., an etching solution, a developing solution, and a stripping solution during subsequent processes.

The second solvent selective photosensitive pattern 152 is formed on the organic semiconductor pattern 141 and may be formed in other regions except for a region where the first solvent selective photosensitive pattern 151 is formed. The second solvent selective photosensitive pattern 152 may be disposed apart from and between the first solvent selective photosensitive patterns 151 and may face each other. The second solvent selective photosensitive pattern 152 like the first solvent selective photosensitive pattern 151 may also reduce or prevent damage on the channel region of the organic semiconductor pattern 141 in the subsequent process.

A source electrode 161 and a drain electrode 162 are formed on the first and second solvent selective photosensitive patterns 151 and 152. The source electrode 161 is connected to a data line (not shown) transferring a data signal. The source electrode 161 and the drain electrode 162 may be made of, for example, gold (Au), copper (Cu), nickel (Ni), aluminum (Al), molybdenum (Mo), chromium (Cr), tantalum (Ta), titanium (Ti), tungsten (W), indium tin oxide (ITO), indium zinc oxide (IZO), or an alloy thereof, or polythiophene, polyaniline, polyacetylene, polypyrrole, polyphenylenevinylene, PEDOT (polyethylene dioxythiophene), PSS (polystyrenesulfonate), and a combination thereof, but are not limited thereto.

The source electrode 161 and the drain electrode 162 face each other and interposed by the first solvent selective photosensitive pattern 151, and are electrically connected with the organic semiconductor pattern 141 on the organic semiconductor pattern 141. Herein, electrically connecting the source electrode 161 and the drain electrode 162 to the organic semiconductor pattern 141 refers to including a structure that directly connects the source electrode 161 and the drain electrode 162 to the organic semiconductor pattern 141, and also including a structure interposing a semiconductive or conductive material therebetween.

As described above, the thin film transistor according to example embodiments has a top contact structure in which the organic semiconductor pattern 141 and the source electrode 161 and the organic semiconductor pattern 141 and the drain electrode 162 are electrically connected to each other on the organic semiconductor pattern 141.

The top contact structure may provide a stable channel of the organic semiconductor pattern 141 by ensuring the continuity of the organic semiconductor pattern 141 compared with a bottom contact in which the organic semiconductor pattern 141 and the source electrode 161 and the organic semiconductor pattern 141 and the drain electrode 162 are electrically connected to each other under the organic semiconductor pattern 141. In addition, the source electrode 161 and the drain electrode 162 are obtained by a process, e.g., deposition and patterning, etc., and then the electrode materials for the source electrode 161 and the drain electrode 162 are directly deposited on the organic semiconductor layer under vacuum to decrease contact resistance between the organic semiconductor pattern 141 and source electrode 161 and between the organic semiconductor pattern 141 and drain electrode 162.

In addition, the thin film transistor according to example embodiments may not affect the chemical characteristics and the electrical characteristics of the organic semiconductor pattern 141 and may reduce or prevent damage to the channel region of the organic semiconductor pattern 141 during subsequent processes, by forming the first and second solvent selective photosensitive patterns 151 and 152 made of the material substantially not causing a chemical interaction with the organic semiconductor pattern 141 at the place corresponding to the channel region of organic semiconductor pattern 141, that is the material being non-reactive with the organic semiconductor pattern 141. In addition, the channel length of thin film transistor may be controlled by adjusting the width of the first solvent selective photosensitive pattern 151, so that a short channel length may be more easily accomplished at less than or equal to about 10 µm, for example less than or equal to about 5 µm. Thus the performance of thin film transistor including the organic semiconductor pattern 141 may be improved.

The thin film transistor may be applied to various electronic devices, e.g., a semiconductor device, a flat panel display, an energy device, and a sensor. The electronic device may include, for example a liquid crystal display (LCD), an organic light emitting diode (OLED) display, a solar cell, and an organic sensor.

Hereinafter, a method of manufacturing a thin film transistor according to example embodiments is illustrated referring to FIGS. 2 to 13 along with FIG. 1.

Figure 2:
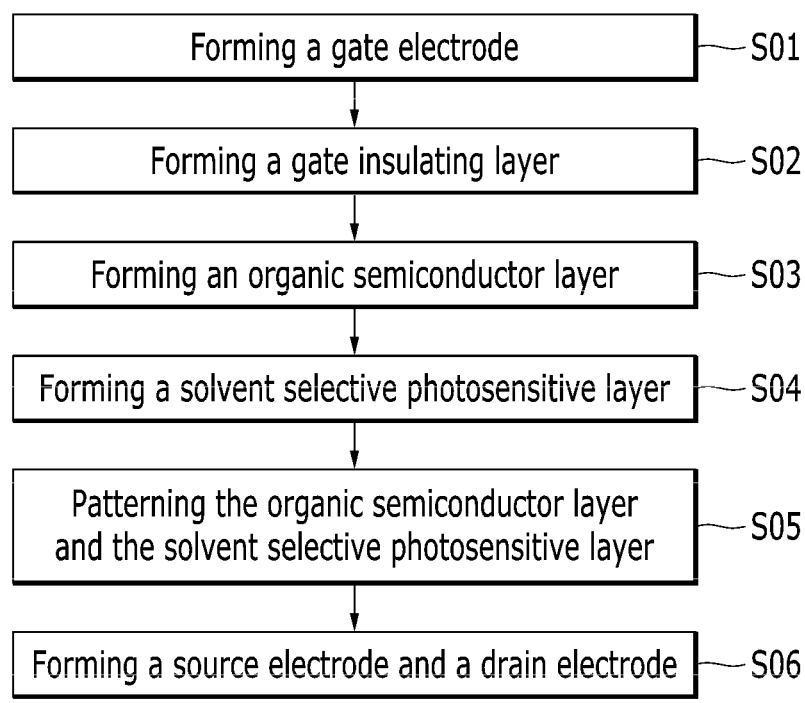
FIG. 2 is a flowchart showing a method of manufacturing a thin film transistor according to example embodiments.

FIG. 2 is a flowchart showing a method of manufacturing a thin film transistor according to example embodiments, and FIGS. 3 to 13 are views sequentially showing a method of manufacturing the thin film transistor according to example embodiments.

Referring to FIG. 2, a method of manufacturing a thin film transistor according to example embodiments includes forming a gate electrode (S01), forming a gate insulating layer on the gate electrode (S02), forming an organic semiconductor layer on the gate insulating layer (S03), forming a solvent selective photosensitive layer on the organic semiconductor layer (S04), patterning the organic semiconductor layer and the solvent selective photosensitive layer together to form an organic semiconductor pattern and a solvent selective photosensitive pattern (S05), and forming a source electrode and a drain electrode that are electrically connected to the organic semiconductor pattern on the organic semiconductor pattern and the solvent selective photosensitive pattern (S06).

Figure 3:
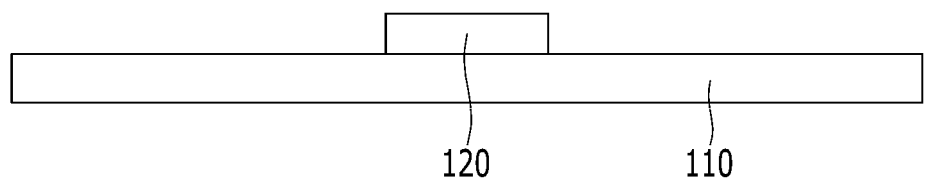
FIGS. 3 to 13 are views sequentially showing a method of manufacturing the thin film transistor according to example embodiments.

Referring to FIG. 3, in forming the gate electrode (S01), the gate electrode 120 is formed by forming a conductive layer on the substrate 110 through sputtering and performing photolithography.

Figure 4:
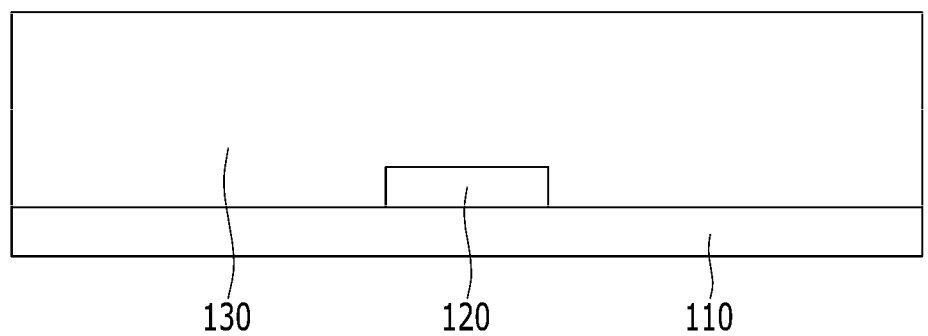

Referring to FIG. 4, in forming the gate insulating layer (S02), the gate insulating layer 130 is formed on the gate electrode 120. The gate insulating layer 130 may be formed, for example, in a dry process, e.g., chemical vapor deposition, or in a solution process, e.g., spin coating, inkjet printing, etc.

Via holes are formed in the gate insulating layer 130 so that the gate insulating layer 130 and the gate electrode 120 formed in subsequent processes are electrically connected to each other.

Figure 5:
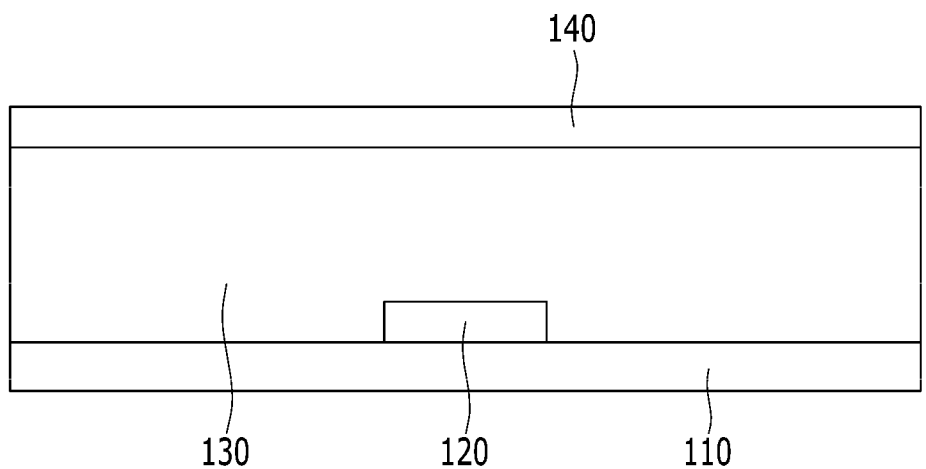

Referring to FIG. 5, in forming the organic semiconductor layer (S03), the organic semiconductor layer 140 is formed on the gate insulating layer 130. The organic semiconductor layer 140 may be obtained by, for example, a dry process, e.g., chemical vapor deposition, or in a solution process, e.g., spin coating, inkjet printing, etc. The formed organic semiconductor layer 140 contacts the gate electrode 120 through via holes formed in the gate insulating layer 130.

Figure 6:
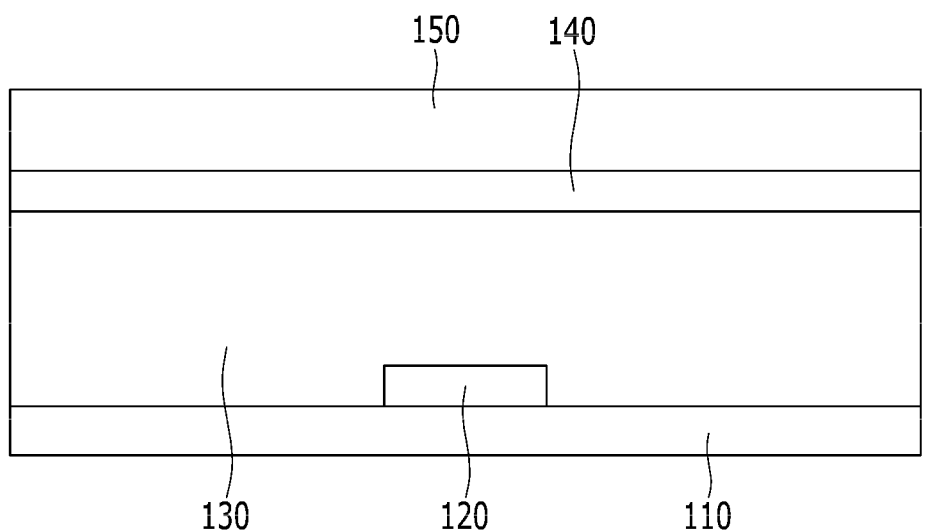

Referring to FIG. 6, in forming the solvent selective photosensitive layer (S04), a composition having a solvent selectivity is coated on the organic semiconductor layer 140 to form a solvent selective photosensitive layer 150.

The composition may include, for example, a compound substantially not causing a chemical interaction with the organic semiconductor layer 140, that is a compound being non-reactive with the organic semiconductor layer 140, for example, a fluorine compound, e.g., a fluorine-containing low molecular weight compound, a fluorine-containing oligomer, a fluorine-containing polymer, or a combination thereof, a photosensitive material, and a fluorine-containing solvent as described above. The composition may be coated by a solution process, for example, spin coating, slit coating, or inkjet printing.

A thickness of the solvent selective photosensitive layer 150 may be altered in various manners according to a condition of the subsequent process, forming the patterns (S05), and may be, for example, greater than or equal to about 0.1 μm, for example, greater than or equal to about 0.2 μm, and for example, less than or equal to about 5 μm, for example, 3 μm, or less than or equal to about 2 μm. When the solvent selective photosensitive layer 150 has a thickness within the range, the height of a groove formed in the solvent selective photosensitive layer 150 and the organic semiconductor layer 140 in the subsequent process of forming the patterns may be more easily adjusted without damaging or deteriorating the organic semiconductor layer 140.

Figure 7:
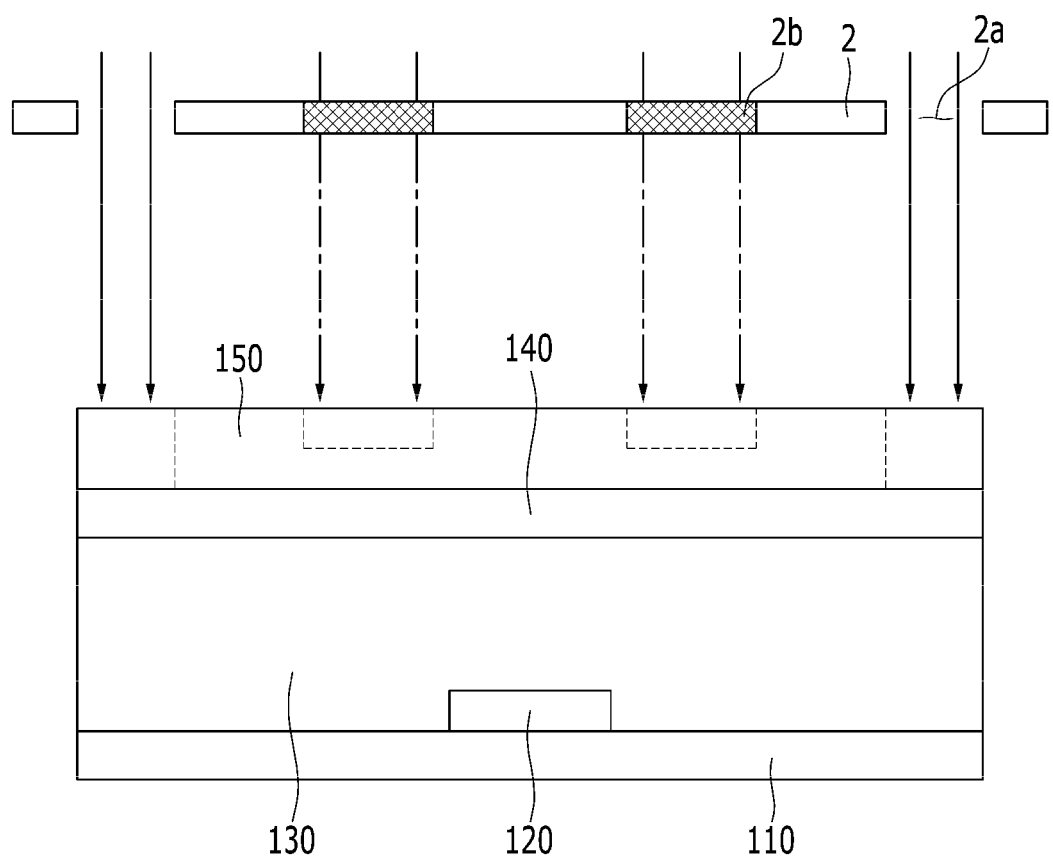
Figure 8:
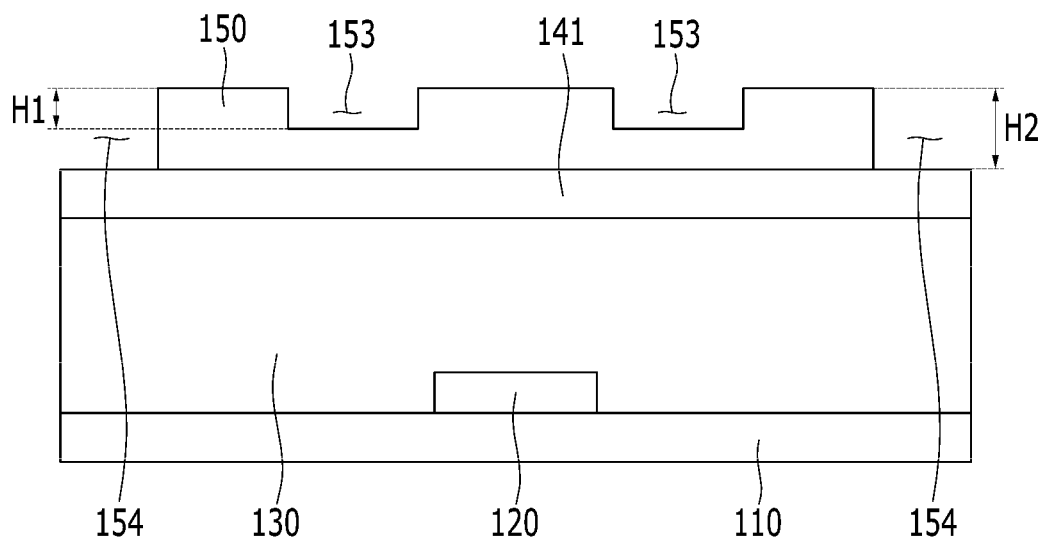

Referring to FIG. 7, a halftone mask 2 is disposed on the solvent selective photosensitive layer 150, and the solvent selective photosensitive layer 150 is exposed and developed to form a first groove 153 and a second groove 154 as shown in FIG. 8 in the formation of the organic semiconductor pattern and the solvent selective photosensitive pattern (S05).

In other words, the formation of the organic semiconductor pattern and the solvent selective photosensitive pattern (S05) includes first patterning a part of the solvent selective photosensitive layer 150 by using the halftone mask 2 and thus forming a step on the upper surface of the solvent selective photosensitive layer 150.

According to example embodiments, the halftone mask 2 may include a transmissive region 2a completely transmitting light at a radiated wavelength and a semitransmissive region 2b partly transmitting light at the radiated wavelength.

The halftone mask 2 may use a transparent substrate, e.g., glass, plastic (polyimide, polyamide, liquid crystal polyarylate, polyethyleneterephthalate, polyetheretherketone, polyethersulfone, polyethernitrile, polyester, polycarbonate, polyarylate, polysulfone, polyetherimide, etc.), and have a light-blocking layer formed of a material completely blocking light at the rest of wavelength in the other regions except for the transmissive region 2a and the semitransmissive region 2b on the substrate. The light-blocking layer may be formed of metal, e.g., chromium (Cr), copper (Cu), aluminum (Al), nickel (Ni), or an alloy thereof, non-metal, e.g., iron oxide, silicon, germanium oxide, chromium oxide, etc., or a combination thereof.

The semitransmissive region 2b may include a silicide compound of non-metal, e.g., chromium oxide, molybdenum oxide, etc., or metal having a relatively high melting point, e.g., titanium, tantalum-based, etc. The semitransmissive region 2b may transmit a part of light at the radiated wavelength.

In example embodiments, light passing the semitransmissive region 2b is radiated in a region marked with a dotted line around the core of the solvent selective photosensitive layer 150 referring to FIG. 7, and a pair of the first grooves 153 is formed apart around the solvent selective photosensitive layer 150 through portion exposed as shown in FIG. 8.

The first grooves 153 have a first depth H1, the first depth H1 may be variously modified depending on a dose of light radiated on the halftone mask, the thickness of the organic semiconductor layer 140, the material of the transmissive region 2b, the thickness of the transmissive region 2b, etc.

On the other hand, light passing the transmissive region 2a is radiated in a region marked with a dotted line around both ends of the solvent selective photosensitive layer 150 in example embodiments. Referring to FIG. 7, the second groove 154 may be formed around both ends of the solvent selective photosensitive layer 150 as shown in FIG. 8.

The second groove 154 may have the same second depth H2 as the thickness of the solvent selective photosensitive layer 150. In other words, the second groove 154 may open the solvent selective photosensitive layer 150 upward and downward, referring to FIG. 8, and thus the upper surface of the semiconductor layer 140 neighboring the second groove 154 may be open outward.

The second groove 154 is a region where the light transmitted by the transmissive region 2a is all radiated, the first groove 153 is a region where the light transmitted by the transmissive region 2b is partly radiated, and accordingly, the second depth H2 may be larger than the first depth H1. In other words, the first depth H1 may be at least smaller than the thickness of the solvent selective photosensitive layer 150.

In this way, when the thickness of the solvent selective photosensitive layer 150 is smaller than the first groove 153 in the first patterning, a part of the organic semiconductor layer 140 contacting the first groove 153 may be reduced or prevented from etching during the subsequent etching process.

In addition, when the first depth H1 and the second depth H2 are different each other, the organic semiconductor layer 140 and the solvent selective photosensitive layer 150 may be patterned together in the subsequent etching process.

Figure 9:
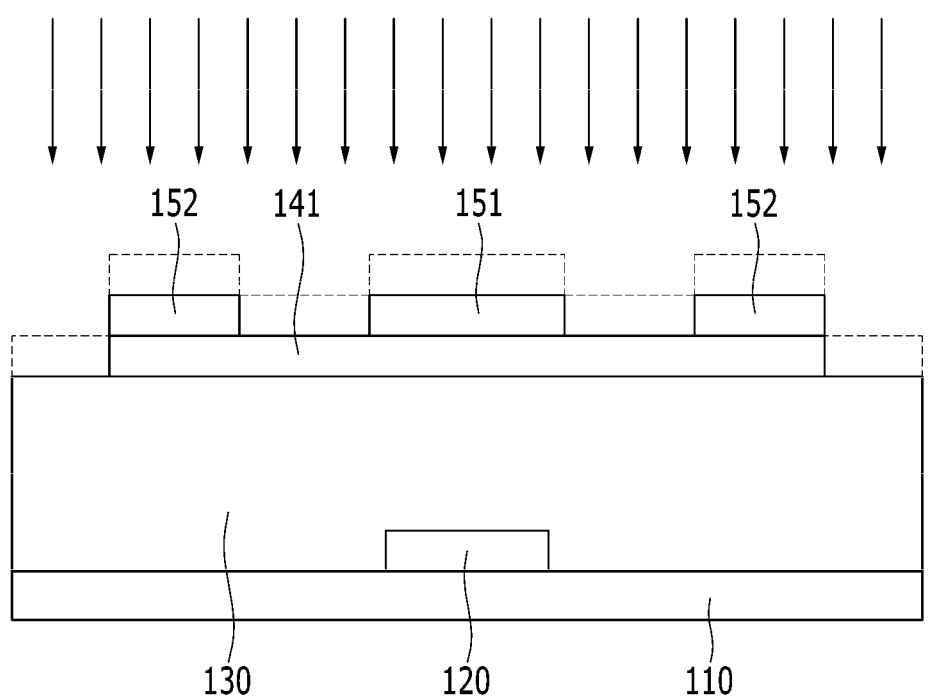

Referring to FIG. 9, the organic semiconductor layer 140 and the solvent selective photosensitive layer 150 of FIG. 8 are etched together to form the organic semiconductor pattern 141 and the first and second solvent selective photosensitive patterns 151 and 152. The etching may be performed by, for example, dry-etching, e.g., reactive ion etching (RIE) using oxygen plasma.

In other words, the formation of the patterns (S05) includes a second patterning process to the partly patterned solvent selective photosensitive layer 150 and the organic semiconductor layer 140 simultaneously without using a separate mask.

In the second patterning process, oxygen plasma may be uniformly supplied to the surface of the solvent selective photosensitive layer 150 and the externally-exposed surface of the organic semiconductor layer 140. Accordingly, the oxygen plasma may uniformly etch and remove the surface of the solvent selective photosensitive layer 150 and the exposed surface of the organic semiconductor layer 140 as shown in FIG. 9. Each part respectively removed from the solvent selective photosensitive layer 150 and the organic semiconductor layer 140 by oxygen plasma are marked as a dotted line as shown in FIG. 9.

As a result, the region of the organic semiconductor layer 140 which contacts the first groove 153 is etched, and the region of the solvent selective photosensitive layer 150 in which the second groove 154 is formed is expanded and thus externally exposes a part of the organic semiconductor pattern 141. The etching and the patterning of the organic semiconductor layer 140 and the solvent selective photosensitive layer 150 may be performed together.

The forming of the organic semiconductor pattern 141 and the first and second solvent selective photosensitive patterns 151 and 152 may be, for example, performed at less than or equal to about 200° C., for example, less than or equal to about 180° C., less than or equal to about 150° C., or less than or equal to about 100° C. By performing the process at a relatively low temperature, deterioration of the organic semiconductor pattern 141 disposed in the lower part may be reduced or prevented.

Figure 10:
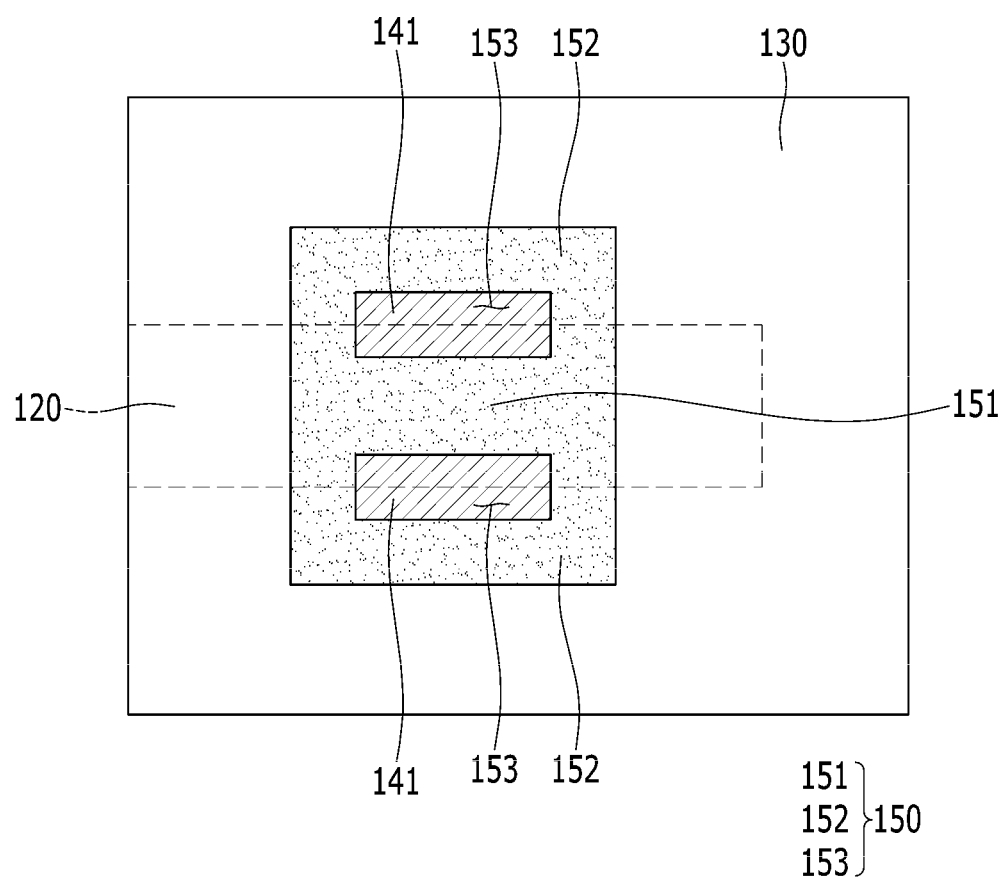

FIG. 10 is a drawing showing the stacking structure of FIG. 9 viewed from the top after the formation of the patterns (S05). The solvent selective photosensitive layer 150 is positioned on the organic semiconductor pattern 141, and a pair of the first grooves 153 is also formed to expose a part of the upper surface of the organic semiconductor pattern 141. The gate electrode 120 is positioned beneath the organic semiconductor pattern 141, and the organic semiconductor pattern 141 and the gate electrode 120 are electrically connected through the above via hole.

Figure 11:
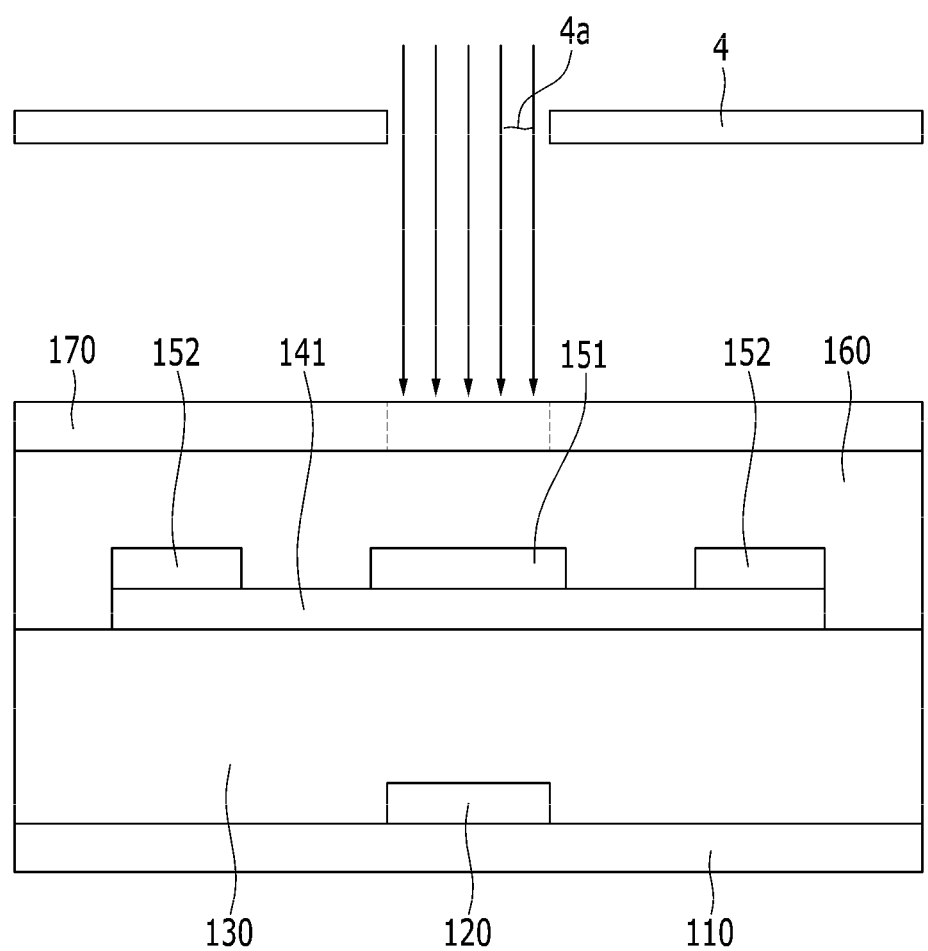
Figure 12:
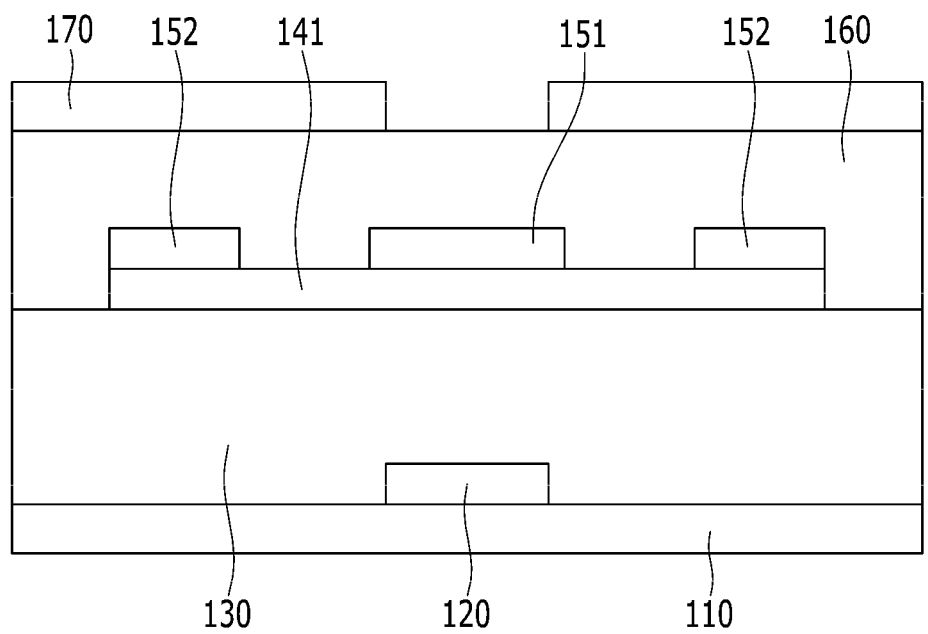
Figure 13:
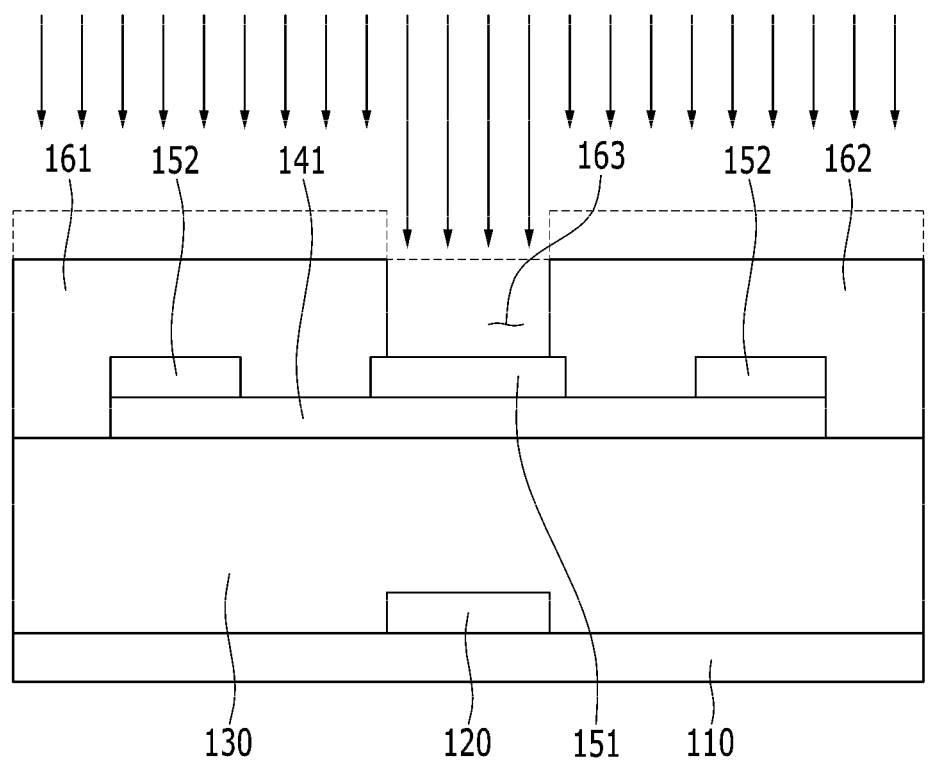

Referring to FIGS. 11 to 13, a conductive layer 160 and a photosensitive layer 170 are first formed in forming a source electrode and a drain electrode (S06).

The conductive layer 160 may be formed to cover the first and second solvent selective photosensitive patterns 151 and 152 and the organic semiconductor pattern 141 using a method of sputtering, etc.

The photosensitive layer 170 is formed on the conductive layer 160 in a method of coating a photosensitive composition, etc. The photosensitive layer 170 may be formed by using the same composition as the composition for forming the solvent selective photosensitive layer 150, but is not limited thereto.

Subsequently, a mask 4 having an aperture pattern 4a is disposed on the photosensitive layer 170, and the photosensitive layer 170 is exposed and developed to from a pattern corresponding to the aperture pattern 4a as shown in FIG. 12.

As shown in FIG. 13, the conductive layer 160 is processed through photolithography using the patterned photosensitive layer 170 as a mask to provide a source electrode 161 and a drain electrode 162 and the photosensitive layer 170 is removed to manufacture the thin film transistor 100 shown in FIG. 1.

According to example embodiments, a channel 163 is formed between the source electrode 161 and the drain electrode 162 during the photolithography process of the conductive layer 160 and expanded toward the organic semiconductor pattern 141 but blocked by the first solvent selective photosensitive pattern 151. In other words, the first solvent selective photosensitive pattern 151 may block permeation of oxygen plasma, an etching solution, etc., into the organic semiconductor pattern 141 during the subsequent process. Accordingly, a thin film transistor manufactured by reducing or minimizing degradation of an organic semiconductor device in the subsequent process may be provided.

A conventional process of forming an organic semiconductor pattern is performed by coating and patterning an organic semiconductor layer on a gate insulating layer to form an organic semiconductor pattern, coating a photosensitive layer as a protective layer thereon, and patterning the organic semiconductor layer and the photosensitive layer again. Accordingly, the conventional process respectively requires one exposure process by using a mask and one development process by wet-etching the exposed photosensitive layer with an etching solution, etc., to form the organic semiconductor pattern and the photosensitive layer pattern and twice in total.

However, this mask process needs a mask having a desired pattern in each process. Thus as the number of the mask processes is increased, it takes more cycles of disposing the increased masks, performing a wet process of development and stripping in the subsequent process, and replacing the masks, resultantly, increasing tact time. In other words, as the number of mask process is increased, the conventional process may not be appropriate for mass production.

However, the method according to example embodiments may improve the tact time by simultaneously patterning the organic semiconductor layer 140 and the solvent selective photosensitive layer 150 with only one mask in the formation of the patterns (S05) and is appropriate for mass production of a device.

In addition, because the wet process of development and stripping may be omitted during the formation of the organic semiconductor layer 140 and the solvent selective photosensitive layer 150, the damage to an organic semiconductor layer 140 may be reduced or prevented due to an etching solution, etc., injected in the wet process.

Hereinafter, the present disclosure is illustrated in more detail with reference to examples. However, these are examples, and the present disclosure is not limited thereto.

Manufacture of Thin Film Transistor

Example

A gate electrode is formed by sputtering molybdenum on a glass substrate and treating it through photolithography. Subsequently, a gate insulating layer is formed by depositing silicon oxide in a chemical vapor deposition (CVD) method. On the surface of the gate insulating layer, a self-assembled layer is formed by using octadecyltrichlorosilane. Subsequently, a heteroacene-based organic semiconductor represented by Chemical Formula 4 is vacuum-deposited to form an organic semiconductor thin film.

[Chemical Formula 4]

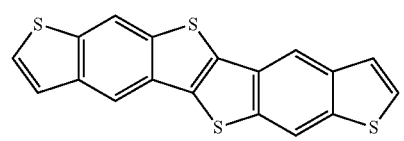

Subsequently, a fluorine-containing photosensitive layer is formed by coating a composition including ethoxynonafluorobutane ($C_4F_9OC_2H_5$, 3M™NoVec™ Co.), a photo acid generator, and a fluorine-containing solvent, and a solvent selectivity photosensitive layer is exposed by using a halftone mask and radiating 365 nm (i-line) light having energy of 50 mJ/cm$^2$ and developed. Then, $O_2$ plasma of 100 sccm and 75 mTorr is applied under a condition of 300 W for 30 seconds to the partly-patterned solvent selectivity photosensitive layer and organic semiconductor thin film to etch them, forming an organic semiconductor pattern and a solvent selectivity photosensitive layer pattern. Subsequently, a gold (Au) thin film and a photoresist photosensitive layer (DS-5700, positive PR, Donjin Semichem Co., Ltd.) are disposed through sputtering in order and treated through photolithography to form a source electrode and a drain electrode, manufacturing a thin film transistor.

Reference Example

An organic semiconductor thin film is formed according to the same method as the Example, and a fluorine-containing photosensitive layer is formed thereon according to the same method as the Example and then, treated through photolithography. Subsequently, the organic semiconductor thin film is etched with oxygen plasma by using the patterned photosensitive layer as a mask, forming an organic semiconductor pattern. The patterned photosensitive layer is peeled off.

Subsequently, the same fluorine-containing photosensitive layer as the Example is formed on the organic semiconductor pattern and treated through photolithography, forming a solvent selectivity photosensitive layer pattern. Then, a thin film transistor is manufactured according to the same method as Example.

Evaluation

Characteristics of the thin film transistors according to the Example and the Reference Example are evaluated. Charge mobility and the number of a mask process of the thin film transistors according to Example and Reference Example are evaluated, and the results are provided in Table 1.

TABLE 1

| | Example | Reference Example |
|---|---|---|
| Charge mobility (cm$^2$/V · s) | 2.949 | 3.098 |
| Threshold voltage (V) | −4.7 | −1.0 |
| Swing voltage (V) | 1.57 | 1.02 |
| $I_{on}$ A | $1.60 \cdot 10^{-4}$ | $1.65 \cdot 10^{-4}$ |
| $I_{off}$ A | $4.66 \cdot 10^{-11}$ | $1.79 \cdot 10^{-13}$ |
| The number of mask process (times) | 3 | 4 |

In Table 1, a gate voltage is swept in a range of −40 V to +40 V, and a drain voltage is −40 V. In addition, $I_{on}$ is a maximum current, and $I_{off}$ is a block leakage current.

Referring to Table 1, the thin film transistor according to the Example shows equivalent charge mobility and other characteristics to the one according to the Reference Example. In addition, an organic semiconductor pattern and a solvent selectivity photosensitive layer pattern may be formed as one mask process in the Example unlike the Reference Example and thus time taken for the mask process including development and striping may be reduced. In other words, a method of appropriately mass-producing a thin film transistor according to example embodiments may be provided, improving tact time.

In addition, as for Reference Example, characteristics of an organic semiconductor device may be deteriorated by a wet environment, e.g., an etching solution, etc., because the solvent selectivity photosensitive layer on the organic semiconductor pattern should be patterned through a separate wet process, e.g., a development process.

However, example embodiments may reduce or minimize exposure of the organic semiconductor thin film to a wet environment by partly patterning a solvent selective photosensitive pattern in advance to partially expose the surface of the organic semiconductor thin film and then, patterning both the selective photosensitive pattern and the surface of the organic semiconductor thin film through dry-etching. In other words, a method of manufacturing a thin film transistor capable of reducing or minimizing damage on an organic semiconductor is provided according to example embodiments.

While this disclosure has been described in connection with what is presently considered to be practical example embodiments, it is to be understood that the inventive concepts are not limited to the disclosed embodiments, but, on the contrary, is intended to cover various modifications and equivalent arrangements included within the spirit and scope of the appended claims.

What is claimed is:

1. A method of manufacturing a thin film transistor, comprising:
    forming a gate electrode;
    forming a gate insulating layer on the gate electrode;
    forming an organic semiconductor layer on the gate insulating layer;
    forming a solvent selective photosensitive layer on the organic semiconductor layer;
    forming an organic semiconductor pattern and a solvent selective photosensitive pattern by simultaneously patterning the organic semiconductor layer and the solvent selective photosensitive layer, respectively; and
    forming a source electrode and a drain electrode on the organic semiconductor pattern and the solvent selective photosensitive pattern, the source electrode and the drain electrode being electrically connected to the organic semiconductor pattern.

2. The method of claim 1, wherein the forming an organic semiconductor pattern and a solvent selective photosensitive pattern comprises:
    exposing the solvent selective photosensitive layer using a halftone mask; and
    developing the exposed solvent selective photosensitive layer.

3. The method of claim 2, wherein the developing forms a first groove and a second groove in the exposed solvent selective photosensitive layer, the first groove having a first depth, and the second groove having a second depth different from the first depth.

4. The method of claim 3, wherein the first depth has a smaller thickness than the exposed solvent selective photosensitive layer.

5. The method of claim 3, wherein the second depth has the same thickness as the exposed solvent selective photosensitive layer.

6. The method of claim 2, wherein the developing exposes at least one portion of the organic semiconductor layer to an external environment.

7. The method of claim 6, wherein the forming an organic semiconductor pattern and a solvent selective photosensitive pattern etches the exposed portion of the organic semiconductor layer and the developed solvent selective photosensitive layer.

8. The method of claim 7, wherein the etching is performed by dry etching.

9. The method of claim 1, wherein the forming an organic semiconductor layer includes one of a solution coating process and a deposition process.

10. The method of claim 1, wherein the forming a solvent selective photosensitive layer coats the solvent selective photosensitive layer with a composition that is non-reactive with the organic semiconductor.

11. The method of claim 10, wherein the composition includes:
a fluorine compound including one of a fluorine-containing low molecular weight compound, a fluorine-containing oligomer, a fluorine-containing polymer, and a combination thereof;
a photosensitive material; and
a fluorine-containing solvent.

12. A thin film transistor manufactured by the method of claim 1.

13. An electronic device including the thin film transistor of claim 12.

14. The electronic device of claim 13, wherein the electronic device includes one of a liquid crystal display (LCD), an organic light emitting diode (OLED) display, an electrophoretic display device, and an organic sensor.

15. A method of manufacturing an electronic device including the method of claim 1.

16. A method comprising:
forming a solvent selective photosensitive layer on an organic semiconductor layer; and
forming an organic semiconductor pattern and a solvent selective photosensitive pattern including,
a first patterning process including patterning the solvent selective photosensitive layer; and
a second patterning process including simultaneously dry-etching the organic semiconductor layer and the patterned solvent selective photosensitive layer, respectively.

17. The method of claim 16, wherein the second patterning process includes a reactive ion etching process (RIE) using oxygen plasma.

18. The method of claim 16, wherein the first patterning process comprises:
exposing the solvent selective photosensitive layer using a halftone mask; and
developing the exposed solvent selective photosensitive layer.

19. The method of claim 16, wherein the forming a solvent selective photosensitive layer coats the solvent selective photosensitive layer with a composition that is non-reactive with the organic semiconductor.

20. The method of claim 19, wherein the composition includes:
a fluorine compound including one of a fluorine-containing low molecular weight compound, a fluorine-containing oligomer, a fluorine-containing polymer, and a combination thereof;
a photosensitive material; and
a fluorine-containing solvent.

* * * * *